(12) United States Patent
Nongaillard et al.

(10) Patent No.: US 12,302,625 B2
(45) Date of Patent: May 13, 2025

(54) ELECTRONIC DEVICE COMPRISING TWO HIGH ELECTRON MOBILITY TRANSISTORS

(71) Applicants: STMicroelectronics France, Montrouge (FR); STMicroelectronics International N.V., Geneva (CH)

(72) Inventors: Matthieu Nongaillard, Grenoble (FR); Thomas Oheix, Grenoble (FR)

(73) Assignees: STMicroelectronics France, Montrouge (FR); STMicroelectronics International N.V., Geneva (CH)

( * ) Notice: Subject to any disclaimer, the term of this patent is extended or adjusted under 35 U.S.C. 154(b) by 551 days.

(21) Appl. No.: 17/709,080

(22) Filed: Mar. 30, 2022

(65) Prior Publication Data

US 2022/0328471 A1    Oct. 13, 2022

(30) Foreign Application Priority Data

Apr. 7, 2021   (FR) ...................... 2103561

(51) Int. Cl.
*H10D 80/20*   (2025.01)
*H01L 25/07*   (2006.01)
*H10D 30/47*   (2025.01)

(52) U.S. Cl.
CPC ......... *H10D 80/251* (2025.01); *H01L 25/074* (2013.01); *H10D 30/471* (2025.01)

(58) Field of Classification Search
CPC ........ H01L 25/074; H10D 30/471–478; H10D 80/251; H10D 88/101
See application file for complete search history.

(56) References Cited

U.S. PATENT DOCUMENTS

| | | | |
|---|---|---|---|
| 2013/0234207 A1 | 9/2013 | Choi et al. | |
| 2014/0091366 A1* | 4/2014 | Jeon ................... | H01L 21/8252 257/195 |
| 2015/0069615 A1 | 3/2015 | Ohno et al. | |

OTHER PUBLICATIONS

Jones et al., "Application-based review of GaN HFETs," *2014 IEEE Workshop on Wide Bandgap Power Devices and Applications*, Oct. 13-15, 2014, Knoxville, TN, pp. 24-29.

* cited by examiner

*Primary Examiner* — Daniel P Shook
(74) *Attorney, Agent, or Firm* — SEED IP LAW GROUP LLP

(57) ABSTRACT

The disclosure concerns an electronic device provided with two high electron mobility transistors stacked on each other and having in common their source, drain, and gate electrodes. For example, each of these electrodes extends perpendicularly to the two transistors. For example, the source and drain electrodes electrically contact the conduction channels of each of the transistors so that said channels are electrically connected in parallel.

20 Claims, 5 Drawing Sheets

ELECTRONIC DEVICE COMPRISING TWO HIGH ELECTRON MOBILITY TRANSISTORS

CROSS REFERENCE TO RELATED APPLICATION(S)

This application is a translation of and claims the priority benefit of French patent application number 2103561, filed on Apr. 7, 2021, entitled "ELECTRONIC DEVICE COMPRISING TWO HIGH ELECTRON MOBILITY TRANSISTORS" which is hereby incorporated by reference to the maximum extent allowable by law.

BACKGROUND

Technical Field

The disclosure relates to the field of electronics, and more for example of power electronics. More for example, the present disclosure concerns an electronic device provided with two high electron mobility transistors.

The device according to the present disclosure is for example arranged to allow a better integration of the two high electron mobility transistors.

The arrangement provided in the present disclosure enables in this regard to obtain a compact device enabling to increase the density of current likely to flow through said device with respect to a single high electron mobility transistor.

Description of the Related Art

High electron mobility transistors ("HEMT") are now widely implemented in the field of hyperfrequencies and that of switches for power electronics converters.

In this regard, HEMT transistors are generally elaborated from layers of III-V semiconductor materials and more for example III-N semiconductor materials.

BRIEF SUMMARY

The disclosure is provides an electronic device comprising two high electron mobility transistors respectively referred to for descriptive purposes as first and second transistors, the first and the second transistors being each provided with a stack, respectively referred to for descriptive purposes as first and second stacks, the first and the second stacks extend from an interface to, respectively, a front side and a back side of the electronic device, and each comprise, from the interface, a barrier layer and a channel layer capable of forming a conduction layer in the form of a two-dimensional electron gas, the two transistors having in common a source electrode and a drain electrode arranged so that electric conduction paths likely to be formed by the two conduction layers are connected in parallel, the two transistors also have in common a gate electrode enabling to impose a conductive state or a non-conductive state to one and the other of the two conduction layers.

Thus, according to the present disclosure, it is possible to increase the density of high electron mobility transistors without increasing the surface area occupied by the electronic device.

Further, the parallel arrangement of the conduction layers of the two transistors enables to increase the current likely to flow through the electronic device and thus open the way to higher power applications.

Further, the electronic device according to the present disclosure requires no resizing of the high electron mobility transistors that it comprises.

Further, the parallel connection of the conduction paths enables to limit the resistivity Ron of the electronic device.

According to an implementation, the interface comprises an insulating layer interposed between the barrier layers of the two stacks, in some implementations, the insulating layer comprises silicon dioxide.

The implementation of the insulating layer enables to efficiently insulate the two barrier layers.

This insulating layer also simplifies the assembly of the two high-mobility transistors. Indeed, the latter enables an assembly by molecular bonding of the two transistors.

According to an implementation, the source electrode and the drain electrode cross the insulating layer, and each extend on either side of said insulating layer to, each, electrically contact the two conduction layers.

According to implementation mode, said electric device comprises a pad, referred to for descriptive purposes as source pad, arranged on the front side and enabling to electrically contact the source electrode.

According to an embodiment, said electric device comprises a contact support having the two high electron mobility transistors resting thereon by the barrier layer on the second transistor.

According to an implementation mode, said electric device comprises a pad, referred to for descriptive purposes as gate pad, arranged on the front side and enabling to electrically contact the gate electrode.

According to an implementation mode, the first stack rests by its channel layer on a contact support, said contact support forming a conductive contact pad electrically connected to the drain electrode, the contact support, in some implementations, comprising doped silicon.

According to an implementation mode, the first and the second stack are essentially identical.

According to an implementation mode, the first and the second transistor have an identical threshold voltage.

According to an implementation mode, the first and the second transistor each have, respectively, a first threshold voltage and a second threshold voltage different from each other.

According to an implementation mode, the first and the second transistor are enhancement mode high electron mobility transistors.

According to an implementation mode, the first and the second transistor are depletion mode high electron mobility transistors.

According to an implementation mode, the source electrode is cascoded with a metal oxide gate field-effect transistor.

According to an implementation mode, the two channel layers comprise GaN and the barrier layers comprise an AlGaN ternary alloy.

BRIEF DESCRIPTION OF THE SEVERAL VIEWS OF THE DRAWINGS

Other features and advantages of the disclosure will appear from the following detailed description in reference to the accompanying drawings, in which.

DETAILED DESCRIPTION

Figure 1:
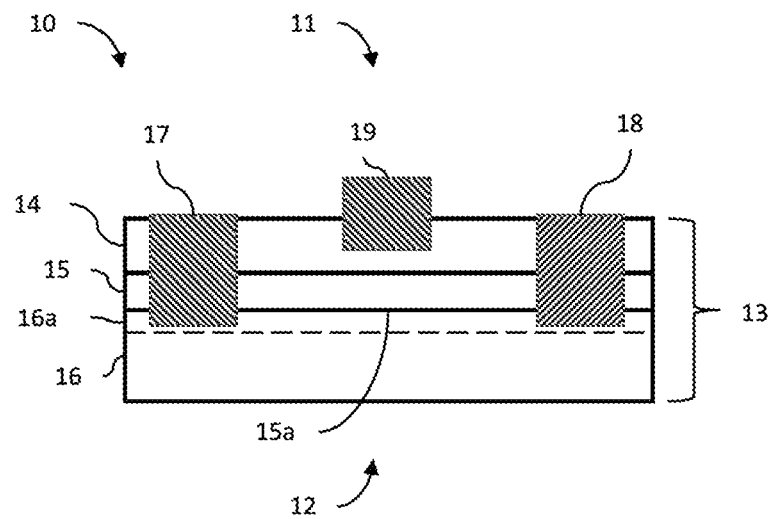
FIG. 1 is a simplified representation of a HEMT transistor shown along a cross-section plane perpendicular to the front side.

FIG. 1 shows a HEMT transistor 10. This HEMT transistor 10 is provided with a stack 13 which comprises, from a front side 11 to a back side 12, an insulator layer 14, a barrier layer 15, and a channel layer 16 capable of forming a conduction layer 16a in the form of a two-dimensional electronic gas layer. In particular, conduction layer 16a extends in channel layer 16 from an interface 15a, formed between barrier layer 15 and said channel layer 16.

The III-V semiconductor materials selected to form barrier layer 15 and/or channel layer 16 may comprise gallium nitride (GaN), aluminum nitride (AlN), $Al_xGa_{1-x}N_x$ ternary alloys, gallium arsenide (GaAs), AlGaAs or InGaAs ternary alloys. For example, barrier layer 15 and channel layer 16 may respectively comprise an AlaGaN compound and GaN. Insulator layer 14 may comprise a dielectric material, and for example silicon dioxide ($SiO_2$) or silicon nitride ($Si_3N_4$).

HEMT transistor 10 also comprises a source electrode 17 and a drain electrode 18 in electric contact with conduction layer 16a. More for example, source electrode 17 and drain electrode 18 emerge through front surface 11, and cross insulator layer 14 and barrier layer 15 to reach interface 15a and electrically contact conduction layer 16a. Source electrode 17 and drain electrode 18 may partially or integrally cross conduction layer 16a. Source electrode 17 and drain electrode 18 may comprise a metal species, for example aluminum, filling trenches formed in stack 13.

HEMT transistor 10 also comprises a gate electrode 19 intended to be imposed a voltage Vg enabling to control the state of conduction layer 16a. For example, as soon as the electric potential difference between gate electrode 19 and source electrode 17, noted Vg-Vs, is greater than a threshold voltage Vth characteristic of HEMT transistor 10, said transistor is in the conductive state. Conversely, as soon as Vg-Vs is smaller than Vth, HEMT transistor 10 is in the non-conductive state, and thus behaves as an off switch.

Thus, depending on the value of threshold voltage Vth, and more for example on its sign, a HEMT transistor may be in depletion (normally-on) mode if its threshold voltage Vth is negative, or in enhancement (normally-off) mode if its threshold voltage Vth is positive.

Such a high electron mobility transistor however has an on-state resistivity Ron (Ron being the on-state drain/source resistance) which limits the intensity of the current likely to flow through the conduction layer.

In this regard, the main parameters influencing resistivity Ron are:
 the surface resistance of the channel layer;
 the resistance of the contacts between the conduction layer and the source and drain electrodes;
 the electric resistivities of the routing metals of the chips;
 the electric resistances induced in the final assembly having the high electron mobility transistor integrated therein.

To overcome this problem, it is possible to significantly decrease the resistivity Ron of a high electron mobility transistor by increasing the surface area thereof. There however exist situations for which the space available for the integration of a high electron mobility transistor is constrained, so that such a solution cannot be envisaged.

As an alternative, it may be considered to optimize the parameters influencing resistivity Ron. Such a solution however remains complex to implement, since it requires, on the one hand, a full resizing of the high electron mobility transistor, and on the other hand a reviewing of the method enabling to manufacture said transistor.

The present disclosure provides a device having its arrangement allowing a greater density of integration of high electron mobility transistors without however significantly increasing the space occupied by said device.

Of course, the disclosure is not limited to the described embodiments and alternative embodiments may be brought thereto without departing from the framework of the disclosure.

Further, it should be understood that the different drawings shown in relation with the present description are given as an illustration only and by no way limit the disclosure. It should for example be clear that the relative scales or dimensions may not be respected.

All throughout the description, it is admitted that a layer or an interface is generally planar and extends along a plane parallel to the (0, x, y) plane of the (0, x, y, z) orthonormal reference frame. Further, as soon as reference is made to a representation along a cross-section plane, the latter is perpendicular to all the planes formed by the layers, and more for example perpendicular to the (0, x, y) plane. It should also be understood that, as soon as reference is made to a stack of layers, the latter are stacked along the z direction of the (0, x, y, z) orthonormal reference frame.

The disclosure concerns an electronic device provided with two high electron mobility transistors stacked on each other and having in common their source, drain, and gate electrodes.

For example, each of these electrodes extends perpendicularly to the two transistors. For example, the source and drain electrodes electrically contact the conduction channels of each of the transistors so that said channels are electrically connected in parallel.

This configuration is example in several respects. Indeed, the parallelizing of the conduction channels of the two transistors enables to increase the intensity of the current likely to flow through the electronic device without having to increase its surface area. Further, this parallelizing also enables to decrease the on-state resistivity Ron of the electronic device.

Figure 2A:
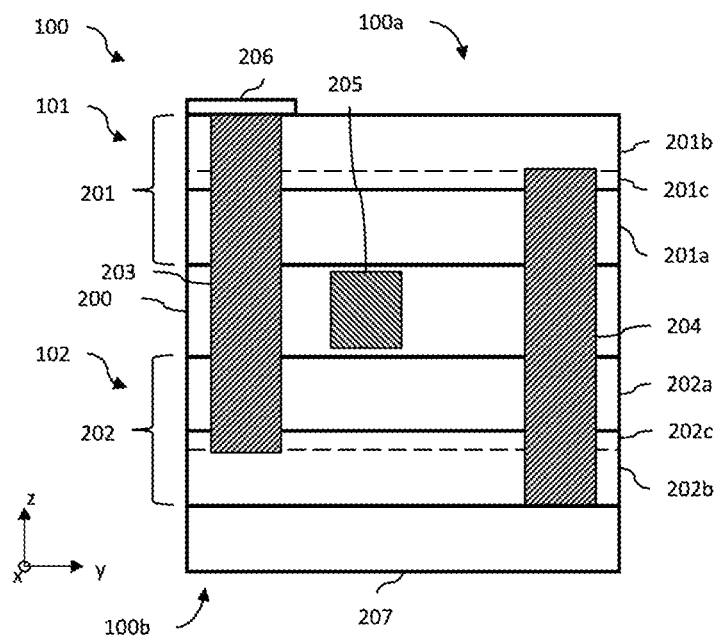
FIG. 2A is a simplified representation of an electronic device, along a cross-section plane, according to the present disclosure.

FIG. 2A shows an example of an electronic device 100 according to an example embodiment of the present disclosure.

Thus, the electronic device 100 according to the present disclosure comprises two high electron mobility transistors ("HEMT transistor"). For example, electronic device 100 comprises, from a front side 100a to a back side 100b, a first HEMT transistor 101 and a second HEMT transistor 102 separated by an insulating layer 200. Insulating layer 200, in some implementations, comprises silicon dioxide.

First transistor 101 and second transistor 102 each comprise a stack of layers respectively referred to as first stack 201 and second stack 202 for descriptive purposes. Each of these stacks may for example comprise group-III-V semiconductor materials, and more for example group-III-N semiconductor materials. The group-III-V semiconductor materials may in particular be selected from among gallium nitride (GaN), aluminum nitride (AlN), and their $Al_xGa_{1-x}N$ ternary alloys, or from among gallium arsenide (GaAs) and its compounds (AlGaAs, InGaAs).

First stack 201 and second stack 202 each comprise a barrier layer and a channel layer. For example, first stack 201 comprises, from insulating layer 200 to front side 100a, a first barrier layer 201a and a first channel layer 201b. Similarly, second stack 202 comprises, from insulating layer 200 to back side 100b, a second barrier layer 202a and a second channel layer 202b.

As an example and according to the present disclosure, a barrier layer may comprise an $Al_xGa_{1-x}N$ ternary alloy while a channel layer may comprise GaN.

Further, a barrier layer may have a thickness in the range from 1 nm to 100 nm.

A channel layer may have a thickness in the range from 10 nm to 2 μm.

A stack 201 or 202, according to the terms of the present disclosure, is capable of forming a two-dimensional electron gas layer (2 DEG) which forms a conduction layer.

The conduction layer, within a stack, extends in the channel layer, from the interface formed between the barrier layer and the channel layer of the considered stack.

Thus, first stack 201 comprises a first conduction layer 201c which extends in the first channel layer 201b, from a first interface formed between first barrier layer 201a and first channel layer 201b.

Second stack 202 comprises a second conduction layer 202c which extends in second channel layer 202b, from a second interface formed between second barrier layer 202a and second channel layer 202b.

Electronic device 100 comprises a source electrode 203 and a drain electrode 204 in electric contact with one or the other of first conduction layer 201c and of second conduction layer 202c. It should be reminded that different types of electric contacts are known to electrically connect the source 203 and drain 204 electrodes to a conduction layer 201c, 202c: in particular, ohmic, tunnel, or Schottky contacts.

In some implementations, source electrode 203 and drain electrode 204 cross insulating layer 200, and each extend on either side of said insulating layer 200 to, each, electrically contact first conduction layer 201c and second conduction layer 202c.

Electric device 100 may comprise a pad, referred to as source pad 206, arranged on a side, e.g., front side 100a, and enabling to electrically contact source electrode 203. Source pad 206, in some implementations, comprises doped silicon.

Electric device 100 may also comprise a contact support 207 having the two high electron mobility transistors resting thereon. Second channel layer 202b is for example in contact with a surface of contact support 207. Contact support is, in this regard, intended to electrically contact drain electrode 204. Contact support 207 may, in some implementations, comprise doped silicon.

The conduction layer of a HEMT transistor, when the latter is conductive, is intended to ensure the conduction of an electric current between the source electrode and the drain electrode of the considered HEMT transistor.

The electronic device 100 according to the present disclosure also comprises a gate electrode 205. Gate electrode 205, in some implementations, is common to first transistor 101 and to second transistor 102.

Gate electrode 205 for example extends along the z direction, perpendicular to the plane formed by insulating layer 200, and remains distant from one and the other of first conduction layer 202a and of second conduction layer 202c.

Figure 2B:
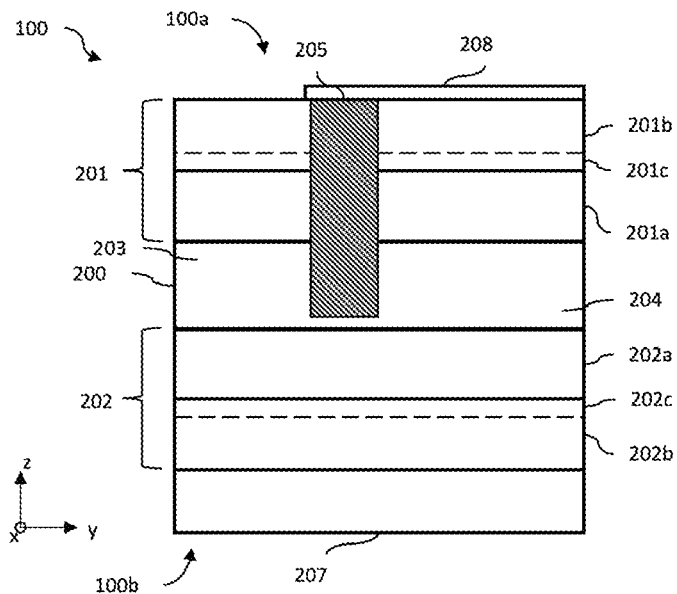
FIG. 2B is a representation illustrating the offset positioning of the gate pad enabling to electrically connect the gate electrode of the electronic device of FIG. 2A.
Figure 2C:
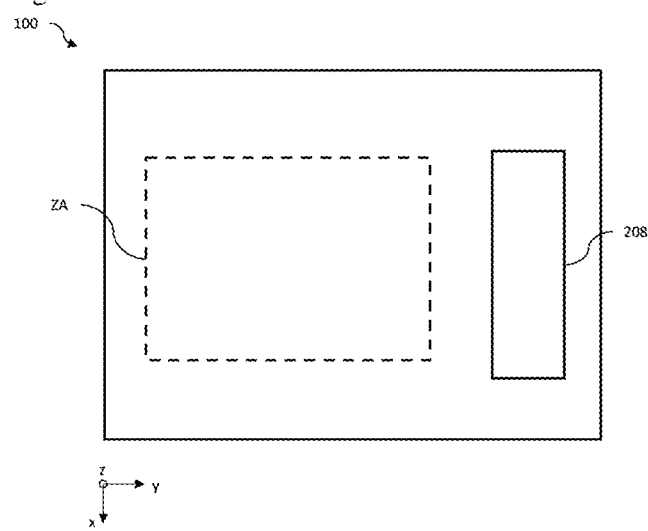
FIG. 2C is a representation illustrating the offset positioning of the gate pad enabling to electrically connect the gate electrode of the electronic device of FIG. 2A in a front view of said device.

Electric device 100 may comprise a pad, referred to for descriptive purposes as gate pad 208, arranged on a side, e.g., the front side 100a, and enabling to electrically contact the gate electrode (FIG. 2B). For example, gate pad 208 is offset from the two HEMT transistors 101 and 102 so as not to risk electrically contacting first conduction layer 201c. "Offset" means a gate pad which is arranged outside of a contour delimiting one and the other of the first and of the second transistor. In this regard, FIG. 2C is a representation of device 100 according to a front view (along a plane parallel to the (0, x, y) plane). The dotted lines delimit an active section ZA of the electronic device within which any contact between the gate electrode and one and the other of the barrier and channel layers is avoided.

Thus, gate electrode 205 is arranged to drive or control the state of one and the other of first transistor 101 and of second transistor 102. For example, this control is executed by imposing an electric potential Vg to gate electrode 205, for example an electric potential difference DDP, noted Vg-Vs between gate electrode 205 and source electrode 203.

Thus, as soon as Vg-Vs is greater than a threshold voltage Vth characteristic of each of transistors 101 and 102, the latter are in the conductive state. Conversely, as soon as Vg-Vs is smaller than Vth, transistors 101 and 102 are in the non-conductive state, and thus behave as off switches.

Thus, depending on the value of threshold voltage Vth, a HEMT transistor may be in depletion, e.g., normally on, mode if its threshold voltage Vth is negative, or in enhancement, normally off, mode if its threshold voltage Vth is positive.

Thus, the HEMT transistors likely to be considered in the present disclosure may be either of normally-on or depletion type, e.g., depletion mode high electron mobility transistor, or of normally-off or enhancement type, e.g., enhancement mode high electron mobility transistor.

In the architecture provided in the present disclosure, first conduction layer 201c and second conduction layer 202c are connected in parallel. Accordingly, if each of the first transistor and of the second transistor have the same on-state resistance Ron, the on-state resistance Ron of the electronic device is equal to resistance Ron/2.

In other words, it is possible, by simple stacking of two high electron mobility transistors, to obtain an electronic device of lower on-state resistance without having to modify the geometric characteristics of said transistors.

In some implementations, the first 201 and the second 202 stacks are essentially identical.

In some implementations, still, the first and the second transistor have an identical threshold voltage Vth.

In some implementations, the first transistor and the second transistor each respectively have a first threshold voltage Vth1 and a second threshold voltage Vth2 different from each other. Thus, according to this configuration, it is possible, via the control of the single gate electrode, to turn on or off one and the other of the first transistor and of the second transistor at different times. This configuration enables to "spread" a current peak likely to appear on switching of these two transistors to the on state.

Figure 3:
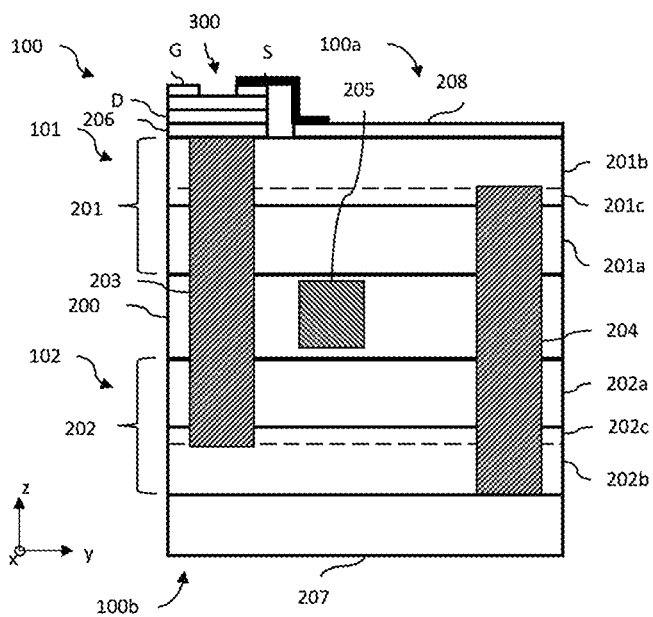
FIG. 3 is a simplified representation of an electronic device, along a cross-section plane, according to the present disclosure, and where the first transistor and the second transistor are normally-on transistors and are cascoded.

FIG. 3 shows an electronic device 100 according to an embodiment of the present disclosure. This embodiment of FIG. 3 comprises most of the features described in relation with FIG. 2A.

In some implementations, first transistor 101 and second transistor 102 are normally on. In other words, these two transistors are conductive for a zero potential difference Vg-Vs.

Thus, to impose a non-zero threshold voltage to electronic device 100, the two transistors 101 and 102 are cascoded with a MOSFET transistor 300.

For example, MOSFET transistor 300 rests by its drain D on source pad 206, and comprises a source S electrically connected to gate pad 208.

Thus, according to this embodiment, the gate G of the MOSFET transistor enables to impose a voltage at the level of source electrode 203.

The present disclosure also concerns a method of manufacturing the above-described electronic device 100.

Figure 4:
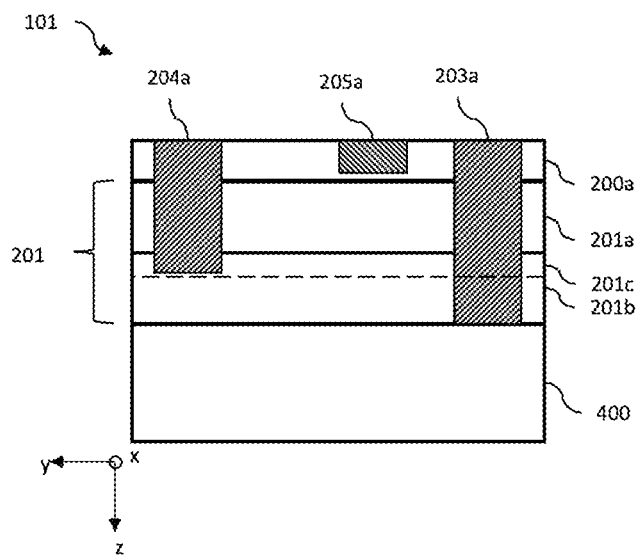
FIG. 4 is a simplified representation of a step of forming of a first transistor according to the terms of the present disclosure.

For example, the method comprises a step of forming of a first transistor 101 (FIG. 4).

For example, the forming of this first transistor 101 comprises an epitaxial growth of first stack 201 on a first surface of a first substrate 400, for example, a silicon substrate. The epitaxial growth may in particular first comprise the forming of first channel layer 201b, and then the forming of first barrier layer 201a.

The epitaxial growth is followed by the forming, covering first barrier layer 201a, of a first insulating layer 200a, which for example comprises silicon dioxide or silicon nitride.

The deposition of insulating layer 200a is then followed by the forming of a first source electrode 203a, of a first drain electrode 204a, and of a first gate electrode 205a. For example, first source electrode 203a extends from the free surface of the first insulating layer and integrally crosses the first insulating layer and first stack 201. First drain electrode 204a extends from the free surface of the first insulating layer to first conduction layer 201c. First gate electrode 205a extends from the free surface of the first insulating layer to the first stack and remains distant from barrier layer 201a.

Figure 5:
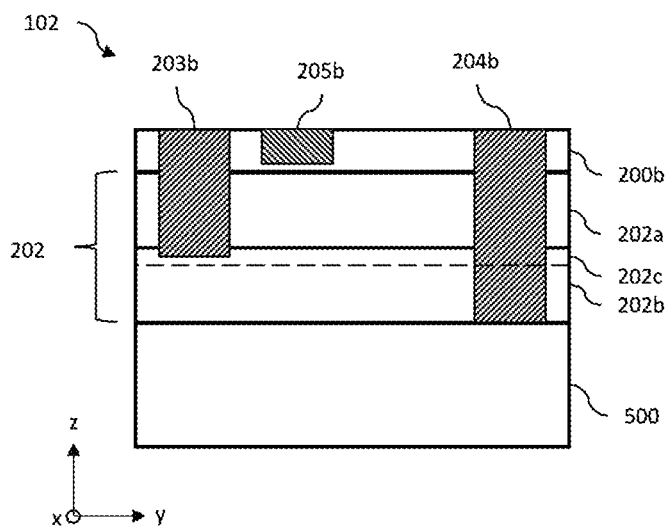
FIG. 5 is a simplified representation of a step of forming of a second transistor according to the terms of the present disclosure.

The manufacturing method comprises a step of forming of a second transistor 102 (FIG. 5).

For example, the forming of this second transistor 102 comprises an epitaxial growth of second stack 202 on a first surface of a second substrate 500, for example a silicon substrate. The epitaxial growth may in particular first comprise the forming of second channel layer 202b, and then the forming of second barrier layer 202a.

The epitaxial growth is followed by the forming, covering second barrier layer 202a, of a second insulating layer 200b, which for example comprises silicon dioxide or silicon nitride.

The deposition of second insulating layer 200b is then followed by the forming of a second source electrode 203b, of a second drain electrode 204b, and of a second gate electrode 205b. For example, second source electrode 203b extends from the free surface of the second insulating layer to second conduction layer 202c. Second drain electrode 204b extends from the free surface of the second insulating layer to integrally cross the second insulating layer and second stack 202. Second gate electrode 205a extends from the free surface of the first insulating layer towards the second stack and remains distant from barrier layer 202a.

These three electrodes 203b, 204b, and 205b, for example, extend from a free surface of second insulating layer 200b to second stack 202.

In some implementations, the drain electrode extends all the way to the interface formed between second stack 202 and second substrate 500.

Figure 6:
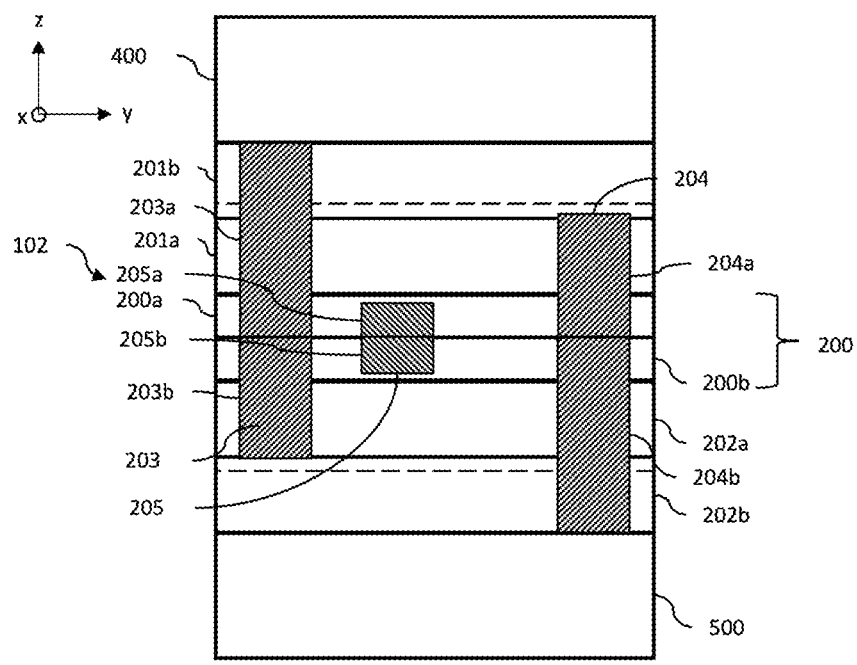
FIG. 6 is a simplified representation of a step of assembly according to the terms of the present disclosure.

The manufacturing method also comprises a step of assembly of first transistor 101 and of second transistor 102 (FIG. 6). In this respect, the assembly step is executed by placing into contact first insulating layer 200a with second insulating layer 200b, and so that first source electrode 203a, first drain electrode 204a, and first gate electrode 205a are in line with, respectively, second source electrode 203b, second drain electrode 204b, and second gate electrode 205b.

In other words, the assembly of the first insulating layer with the second insulating layer forms insulating layer 200. The assembly of first source electrode 203a with second source electrode 203b forms source electrode 203. The assembly of first drain electrode 204a with second drain electrode 204b forms drain electrode 204. The assembly of first gate electrode 205a with second gate electrode 205b forms gate electrode 205.

It should further be noted that this assembly step may be performed according to a board-to-board mode. More for example, the method may comprise the forming of a plurality of first transistors formed on the first substrate, and a plurality of second transistors formed on the second substrate. These two substrates are then assembled to place each first transistor opposite a second transistor.

In some implementations, the assembly may comprise a pick-and-place step. For example, each first transistor may be placed individually on each second transistor formed on the second substrate.

In some implementations, the first transistors and the second transistors are all singularized, and then assembled two by two.

Figure 7:
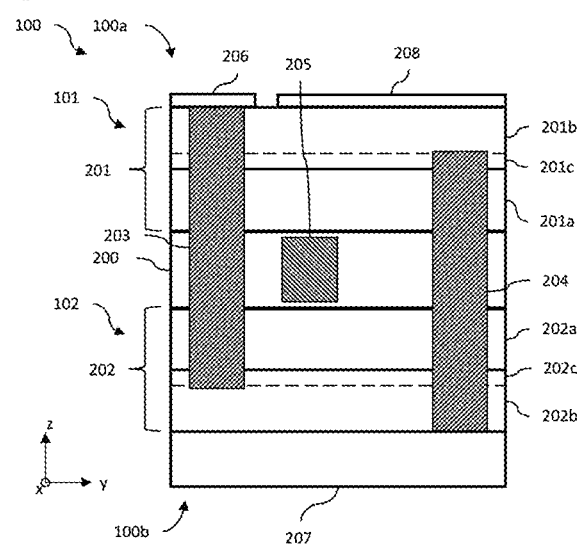
FIG. 7 is a simplified representation of a step of forming of pads intended to electrically contact the source and gate electrodes.

In a last step, the source and gate pads are formed by thinning and patterning, e.g., by etching, of the first substrate (FIG. 7).

The electronic device according to the present disclosure is, in some implementations, implemented in an electric energy management/consumption system.

More for example, the management system may comprise energy storage means and a path of consumption of said energy. The storage means for example are a battery or an accumulator.

The consumption path may be an electric motor. Thus, the electronic device 100 according to the present disclosure is, in some implementations, implemented in an electric vehicle (car, truck, bicycle, train).

An electronic device (100) may be summarized as including two high electron mobility transistors respectively referred to for descriptive purposes as first (101) and second (102) transistors, the first (101) and the second (102) transistors being each provided with a stack, respectively referred to for descriptive purposes as first (201) and second (202) stacks and between which is interposed an insulating layer (200), the first (201) and the second (202) stacks extend from the insulating layer (200) to, respectively, a front side (100a) and a back side (100b) of the electronic device, and each include, from the insulating layer (200), a barrier layer (202a, 201a) and a channel layer (201b, 202b) capable of forming a conduction layer (201c, 202c) in the form of a two-dimensional electron gas, the two transistors having in common a source electrode (203) and a drain electrode (204) arranged so that electric conduction paths likely to be formed by the two conduction layers (201c, 202c) are connected in parallel, the two transistors (101, 102) also have in common a gate electrode (205) enabling to impose an on state or an off state to one and the other of the two conduction layers.

The insulating layer (200) may include a dielectric material, in some implementations, silicon dioxide.

The source electrode (203) and the drain electrode (204) may cross the insulating layer, and each extend on either side of said insulating layer (200) to, each, electrically contact the two conduction layers (201c, 202c).

Said electric device may include a pad, referred to for descriptive purposes as source pad, arranged on the front side and enabling to electrically contact the source electrode (203).

Said electric device may include a contact support having the two high electron mobility transistors resting thereon by the barrier layer (202a, 201a) on the second transistor.

Said electric device may include a pad, referred to for descriptive purposes as gate pad, arranged on the front side and enabling to electrically contact the gate electrode (205).

The first and the second stack may be essentially identical.

The first and the second transistor may have an identical threshold voltage.

The first and the second transistor each may have, respectively, a first threshold voltage and a second threshold voltage different from each other.

The first and the second transistor may be enhancement mode high electronic mobility transistors.

The first and the second transistor may be depletion mode high electron mobility transistors.

The source electrode (203) may be cascoded with a metal-oxide gate field-effect transistor.

The two channel layers comprise GaN and the barrier layers comprise an AlGaN ternary alloy.

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
a first high electron mobility (HEMT) transistor; and
a second HEMT transistor,
wherein the first HEMT transistor includes a first stack of layers extending from an insulating layer toward a first side of the electronic device, and the second HEMT transistor includes a second stack of layers extending from the insulating layer toward a second side of the electronic device that is opposite to the first side, the first stack of layers and the second stack of layers each including, from the insulating layer, a barrier layer and a channel layer capable of forming a conduction region of a two-dimensional electron gas; and
wherein the first and second HEMT transistors have in common a source electrode, a drain electrode, and a gate electrode.

2. The device according to claim 1, wherein the insulating layer includes silicon dioxide.

3. The device according to claim 1, wherein the source electrode and the drain electrode each crosses the insulating layer, and each in contact with the conduction region of the channel layer of the first stack of layers and the conductive region of the channel layer of the second stack of layers.

4. The device according to claim 1, further comprising a source pad, arranged on the first side and in contact with the source electrode.

5. The device according to claim 1, further comprising a contact support on the channel layer of the second HEMT transistor.

6. The device according to claim 1, further comprising a gate pad, arranged on the first side and in contact with the gate electrode.

7. The device according to claim 1, wherein the first and the second stack of layers mirror one another.

8. The device according to claim 1, wherein the first HEMT transistor and the second HEMT transistor have a same threshold voltage.

9. The device according to claim 1, wherein the first HEMT transistor has a first threshold voltage and the second HEMT transistor has a second threshold voltage different from the first threshold voltage.

10. The device according to claim 1, wherein the first HEMT transistor and the second HEMT transistor are enhancement mode high electronic mobility transistors.

11. The device according to claim 1, wherein the first HEMT transistor and the second HEMT transistor are depletion mode high electron mobility transistors.

12. The device according to claim 11, further comprising a metal-oxide-semiconductor field-effect transistor, wherein the source electrode is coupled to a drain terminal of the metal-oxide-semiconductor field-effect transistor and the gate electrode is coupled to a source terminal of the metal-oxide-semiconductor field-effect transistor.

13. The device according to claim 1, wherein the channel layers each includes GaN and the barrier layers each includes an AlGaN ternary alloy.

14. A structure, comprising:
a dielectric layer;
a first stack of layers on a first side of the dielectric layer, the first stack of layers including a first III-V semiconductor layer and a second III-V semiconductor layer, the first III-V semiconductor layer closer to the first side of the dielectric layer than the second III-V semiconductor layer;
a second stack of layers on a second side of the dielectric layer opposite to the first side, the second stack of layers including a third III-V semiconductor layer and a fourth III-V semiconductor layer, the third III-V semiconductor layer closer to the second side of the dielectric layer than the fourth III-V semiconductor layer; and
a first electrode in contact with both the second III-V semiconductor layer and the fourth III-V semiconductor layer.

15. The structure according to claim 14, comprising a gate electrode and a second electrode, the second electrode in contact with both the second III-V semiconductor layer and the fourth III-V semiconductor layer, the gate electrode between the first electrode and the second electrode.

16. The structure according to claim 15, further comprising a conductive layer on the fourth III-V semiconductor layer, the conductive layer in contact with the first electrode, the second electrode extending from the second III-V semiconductor layer toward the conductive layer and terminating before reaching the conductive layer.

17. The structure according to claim 14, wherein the second III-V semiconductor layer and the fourth III-V semiconductor layer are gallium nitride.

18. The structure according to claim 14, wherein the first III-V semiconductor layer and the third III-V semiconductor layer are aluminium gallium nitride.

19. A device, comprising
a first body; and
a second body, each of the first body and the second body including:
a stack of layers including an insulating layer having a first surface and a second surface opposite to the first surface, a first layer of a first III-V semiconductor material on the second surface of the insulating layer, and a second layer of a second III-V semiconductor material on the first layer; and
an electrode extending from the first surface of the insulating layer to the second layer of the second III-V semiconductor material,
the first surface of the insulating layer of the first body being bonded to the first surface of the insulating layer of the second body,
the electrode of the first body being aligned with the electrode of the second body.

20. The device according to claim 19, further comprising:
a conductive substrate, the first body being on the conductive substrate.

* * * * *